(12) United States Patent
Gambino et al.

(10) Patent No.: US 8,017,995 B2
(45) Date of Patent: Sep. 13, 2011

(54) DEEP TRENCH SEMICONDUCTOR STRUCTURE AND METHOD

(75) Inventors: Jeffrey Peter Gambino, Westford, VT (US); Benjamin Thomas Voegeli, Burlington, VT (US); Steven Howard Voldman, South Burlington, VT (US); Michael Joseph Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 11/942,756

(22) Filed: Nov. 20, 2007

(65) Prior Publication Data
US 2009/0127619 A1    May 21, 2009

(51) Int. Cl.
| H01L 31/119 | (2006.01) |
| H01L 29/76  | (2006.01) |
| H01L 29/94  | (2006.01) |
| H01L 31/062 | (2006.01) |
| H01L 31/113 | (2006.01) |

(52) U.S. Cl. ........ 257/334; 257/347; 257/517; 257/328; 257/E21.158

(58) Field of Classification Search .................. 257/347, 257/517, E21.158, 328–336
See application file for complete search history.

(56) References Cited

U.S. PATENT DOCUMENTS

| 5,731,941 | A  | * | 3/1998  | Hargrove et al. ............... 361/56 |
| 6,204,533 | B1 |   | 3/2001  | Williams et al. |
| 6,255,692 | B1 |   | 7/2001  | Huang |
| 7,135,740 | B2 |   | 11/2006 | Chang |
| 7,154,135 | B2 |   | 12/2006 | Hackler, Sr. et al. |
| 2007/0069287 | A1 | * | 3/2007  | Takahashi ..................... 257/330 |
| 2009/0075435 | A1 | * | 3/2009  | Vora .............................. 438/149 |

* cited by examiner

*Primary Examiner* — Cuong Q Nguyen
*Assistant Examiner* — Cathy N Lam
(74) *Attorney, Agent, or Firm* — Schmeiser, Olsen & Watts; Richard M. Kotulak

(57) ABSTRACT

An electrical structure and method of forming. The electrical structure includes a semiconductor substrate comprising a deep trench, an oxide liner layer is formed over an exterior surface of the deep trench, and a field effect transistor (FET) formed within the semiconductor substrate. The first FET includes a source structure, a drain structure, and a gate structure. The gate structure includes a gate contact connected to a polysilicon fill structure. The polysilicon fill structure is formed over the oxide liner layer and within the deep trench. The polysilicon fill structure is configured to flow current laterally across the polysilicon fill structure such that the current will flow parallel to a top surface of the semiconductor substrate.

14 Claims, 22 Drawing Sheets

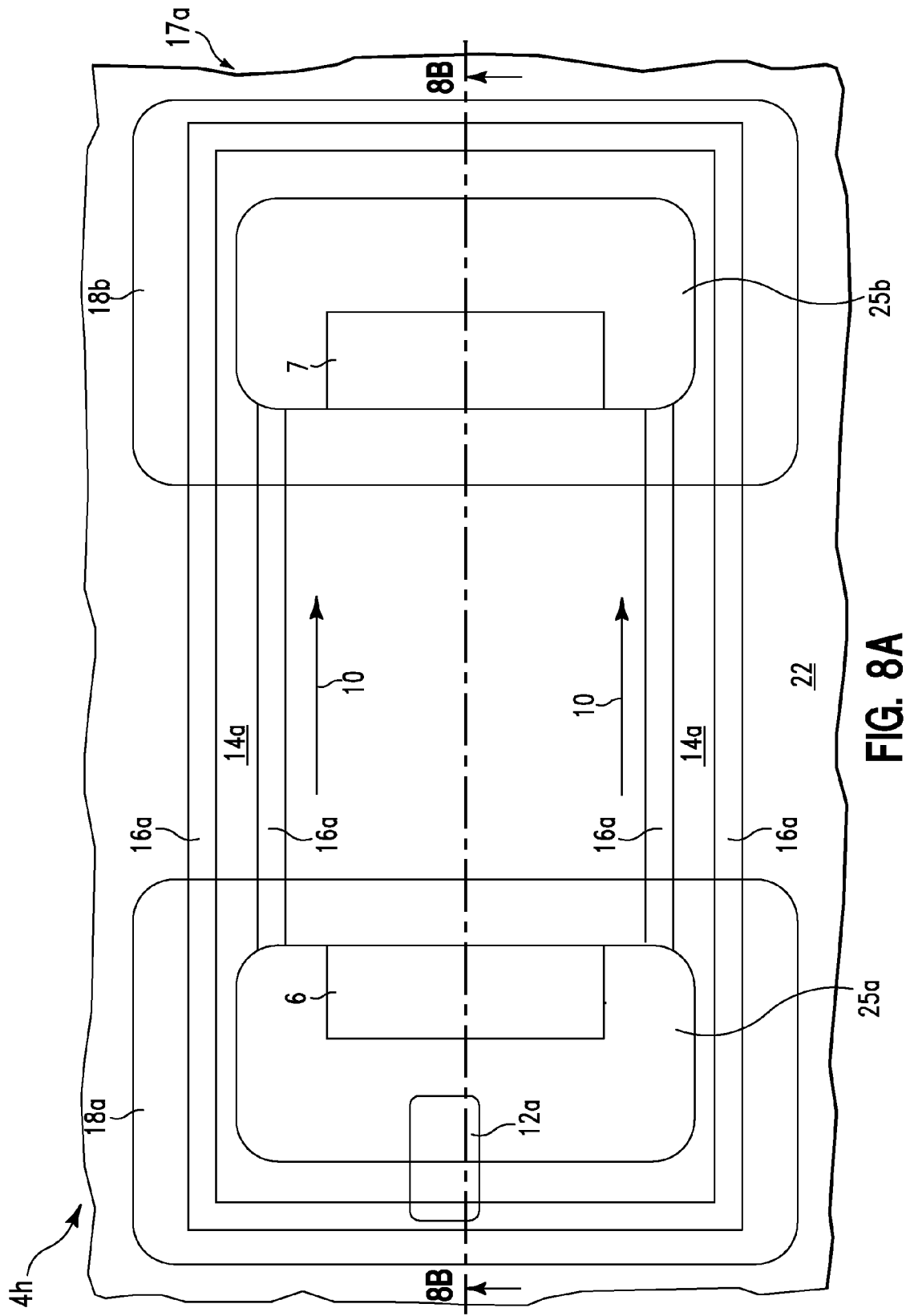

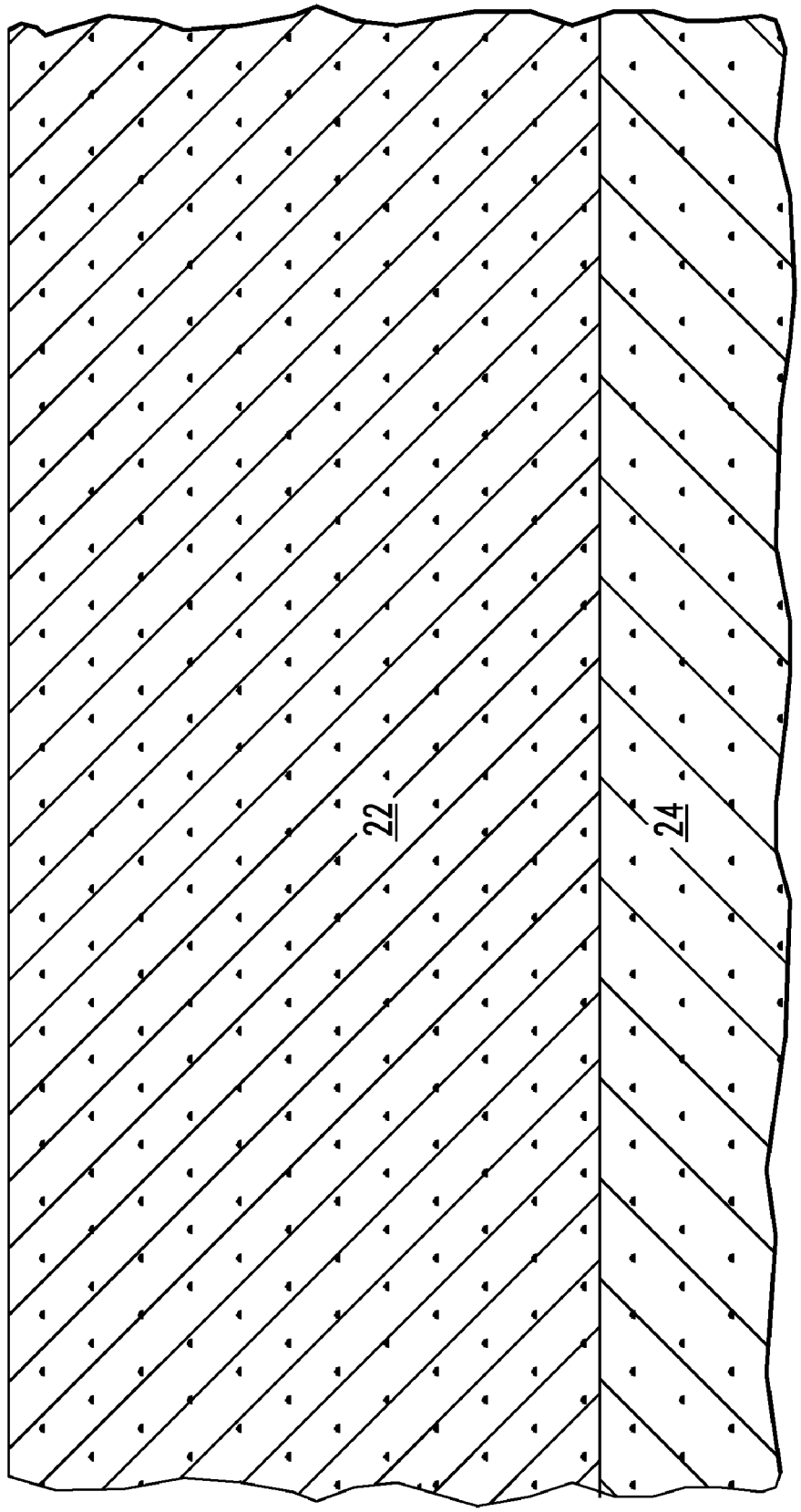

DEEP TRENCH SEMICONDUCTOR STRUCTURE AND METHOD

FIELD OF THE INVENTION

The present invention relates to a field effect transistor comprising a gate structure formed in a deep trench.

BACKGROUND OF THE INVENTION

Structures formed on a substrate typically do not comprise the ability to isolate the structures from additional structures on the substrate. Accordingly, there exists a need in the art to overcome at least one of the deficiencies and limitations described herein above.

SUMMARY OF THE INVENTION

The present invention provides an electrical structure comprising:
a semiconductor substrate comprising a deep trench;
an oxide liner layer formed over an exterior surface of said deep trench; and
a first field effect transistor (FET) formed within said semiconductor substrate, wherein said first FET comprises a first source structure, a first drain structure, and a first gate structure, wherein said first gate structure comprises a first gate contact connected to a first polysilicon fill structure, wherein said first polysilicon fill structure is formed over said oxide liner layer and within said deep trench, wherein said first polysilicon fill structure is configured to flow current laterally across said first polysilicon fill structure such that said current will flow parallel to a top surface of said semiconductor substrate.

The present invention provides a method for forming an electrical structure comprising:
providing a semiconductor substrate;
forming a deep trench structure within said semiconductor substrate;
forming an oxide liner layer over an exterior surface of said deep trench; and
forming a first field effect transistor (FET) within said semiconductor substrate, wherein said first FET comprises a first source structure, a first drain structure, and a first gate structure, wherein said first gate structure comprises a first gate contact connected to a first polysilicon fill structure, wherein said first polysilicon fill structure is formed over said oxide liner layer and within said deep trench, wherein said first polysilicon fill structure is configured to flow current laterally across said first polysilicon fill structure such that said current will flow parallel to a top surface of said semiconductor substrate.

The present invention advantageously provides a simple structure and associated method for isolating structures from additional structures on a substrate.

BRIEF DESCRIPTION OF THE DRAWINGS

FIG. 8A depicts a combination FIGS. 2A and 3A, in accordance with embodiments of the present invention.

FIGS. 9A-4H illustrate a process for generating the electrical structure of FIGS. 8A and 8B, in accordance with embodiments of the present invention.

DETAILED DESCRIPTION OF THE INVENTION

Figure 1A:
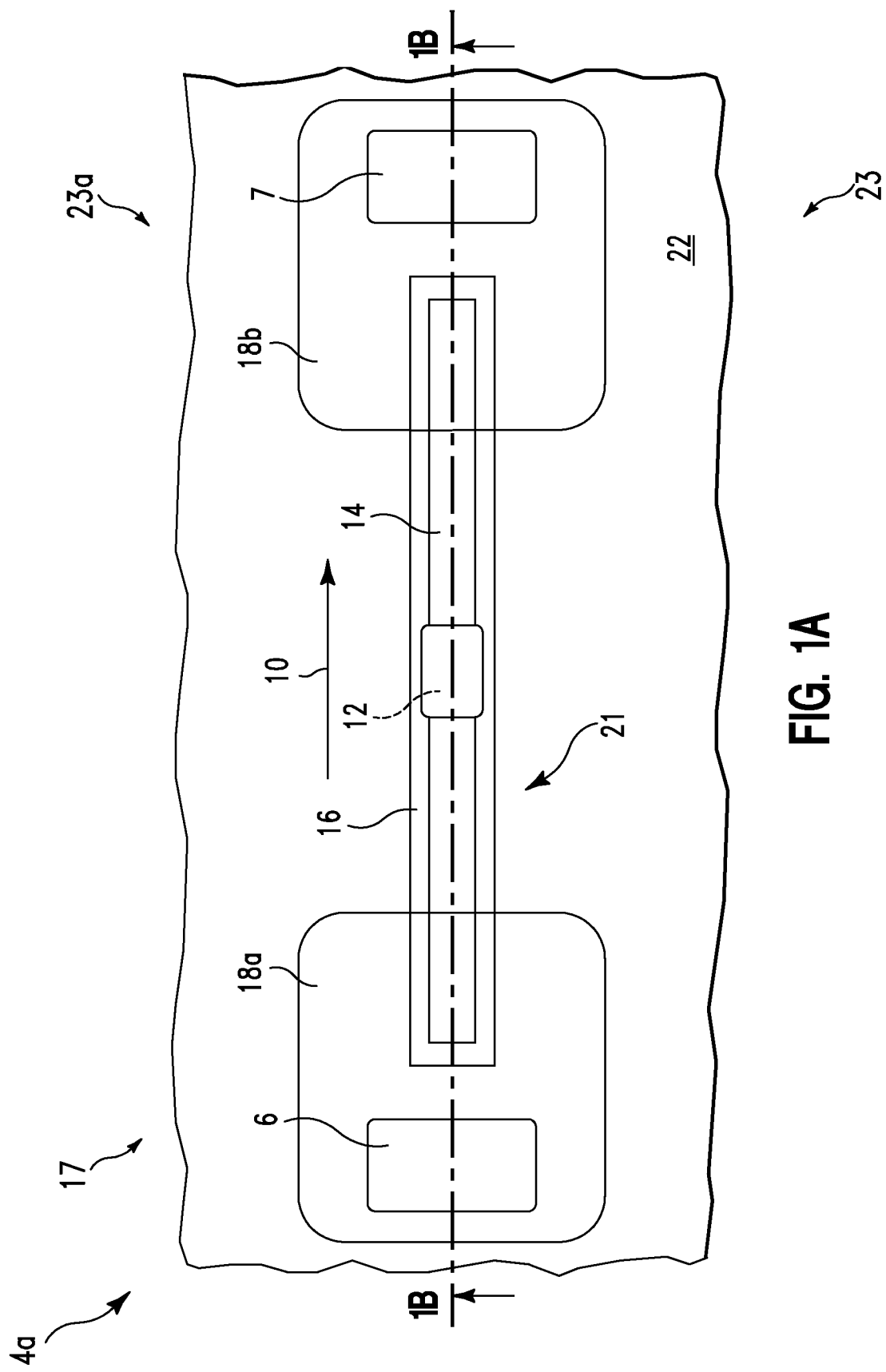
FIG. 1A illustrates a top view of an electrical structure, in accordance with embodiments of the present invention.

FIG. 1A illustrates a top view of an electrical structure 4a, in accordance with embodiments of the present invention. Electrical structure 4a may be any type of electrical structure that comprises electrical circuits including, inter alia, a semiconductor chip. Electrical structure 4a comprises a field effect transistor (FET) 17 formed on a semiconductor substrate 23 (i.e., see FIG. 2). Semiconductor substrate 23 comprises a P substrate 24 and a silicon layer 22 (i.e., N-tub layer) formed from a portion of P substrate. An N-tub layer comprises a highly graded junction layer diffused to provide high voltage isolation. FET 17 comprises a P+ source structure 6 formed over a P-tub 18a, a P+drain structure 7 formed over a P-tub 18b, a gate dielectric (e.g., oxide) liner 16, a gate structure 14 formed over gate dielectric liner 16, and a gate contact 12 connected to gate structure 14. Source structure 6 may comprise a silicide contact layer 30a. Drain structure 7 may comprise a silicide contact layer 30c. Gate contact 12 may comprise a silicide contact layer 30b. Gate dielectric (e.g., oxide) liner 16 may comprise a thickness of about 3000 A. P-tub 18a and P-tub 18b are formed from implants formed within silicon layer 22 (i.e., N-tub layer). A P-tub comprises a highly graded junction layer diffused to provide high voltage isolation. Gate dielectric liner 16 is formed within a deep trench 21 formed within P-tub 18a, P-tub 18b, and silicon layer 22 (i.e., N-tub layer). Gate structure 14 comprises a poly-silicon fill structure. Gate structure 14 is formed over gate dielectric (e.g., oxide) liner 16 and within deep trench 21. A deep trench is defined herein as a trench formed within a substrate (e.g., semiconductor substrate 23) that comprises a depth of at least 6 um. Gate structure 14 is configured to flow current laterally (i.e., in a direction 10) across gate structure 14 such that the current will flow parallel to a top surface 23a of semiconductor substrate 23. FET 17 is a high voltage FET configured to operate at voltages selected from a range of about 10 volts to about 200 volts.

Figure 1B:
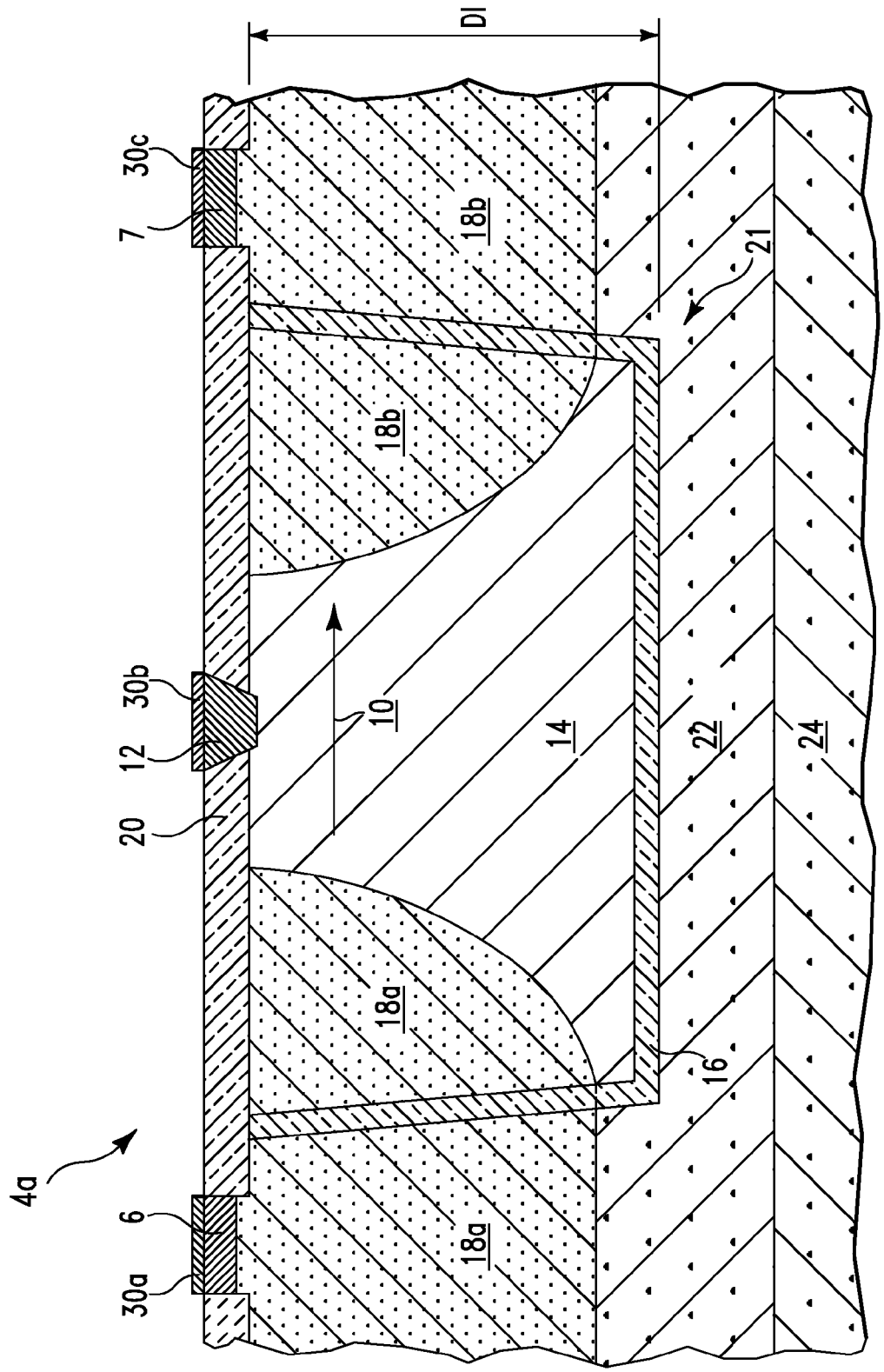
FIG. 1B illustrates a cross sectional view of the electrical structure of FIG. 1A, in accordance with embodiments of the present invention.

FIG. 1B illustrates a cross sectional view of electrical structure 2a of FIG. 1A, in accordance with embodiments of the present invention. The cross sectional view of FIG. 1B is taken along line 1B-1B of FIG. 1A. The cross sectional view in FIG. 2 illustrates the depth D1 of deep trench 21 comprising gate structure 14 is formed over gate dielectric (e.g., oxide) liner 16. Additionally, the cross sectional view in FIG. 2 illustrates a shallow trench isolation (STI) structure 20 formed over P-tub 18a, P-tub 18b, and gate structure 14 and surrounding source structure 6, drain structure 7, and gate contact 12.

Figure 2A:
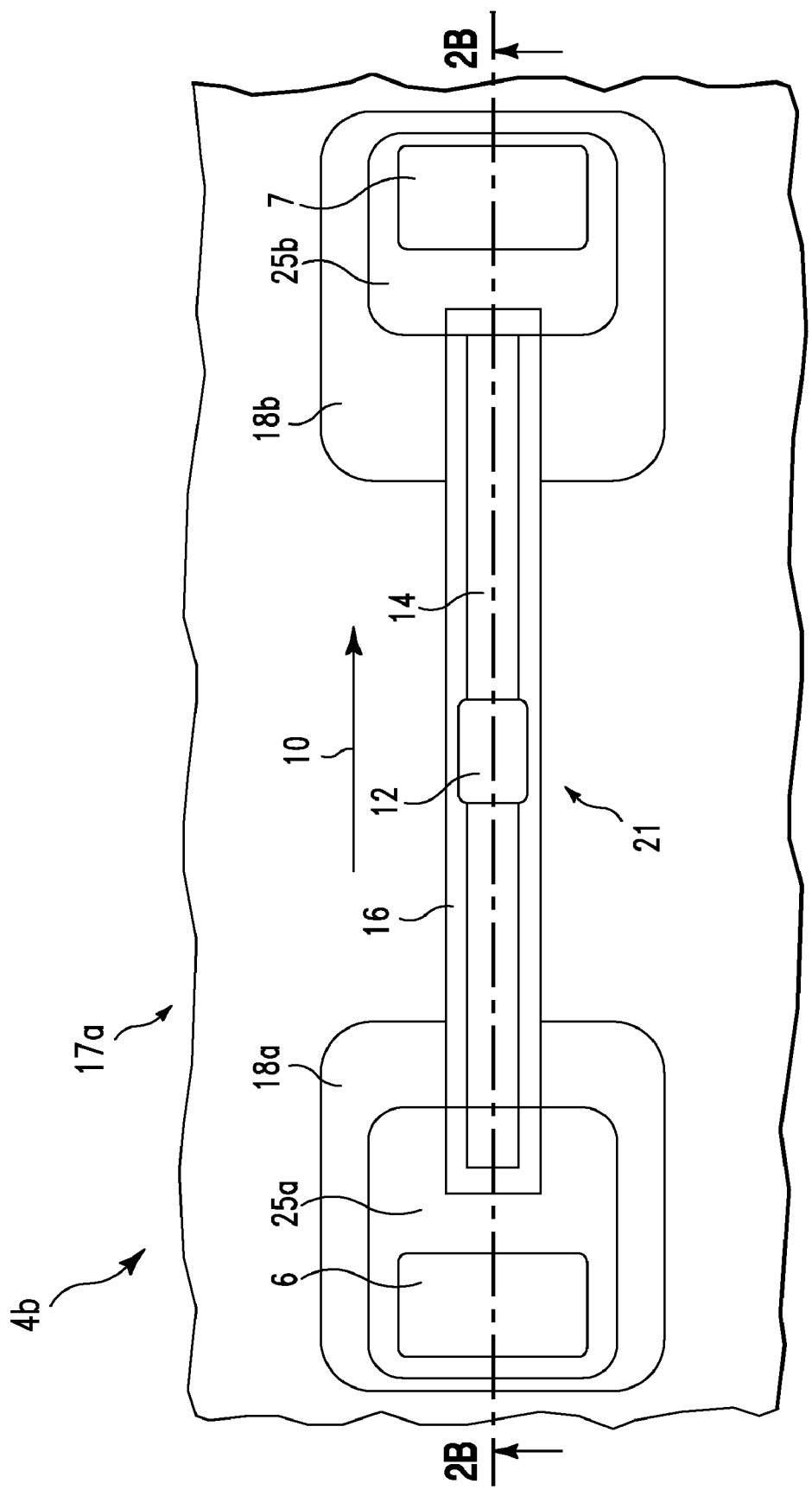
FIG. 2A depicts a first alternative to FIG. 1A, in accordance with embodiments of the present invention

FIG. 2A depicts a first alternative to FIG. 1A illustrating a top view of an electrical structure 4b, in accordance with embodiments of the present invention. In contrast with electrical structure 4a FIG. 1A, electrical structure 4b of FIG. 2A comprises an FET 17a that comprises a P-well 25a formed between P-tub 18a and source structure 6 and a P-well 25b formed between P-tub 18b and drain structure 7. A P-well is defined herein as a moderately P doped CMOS device.

Figure 2B:
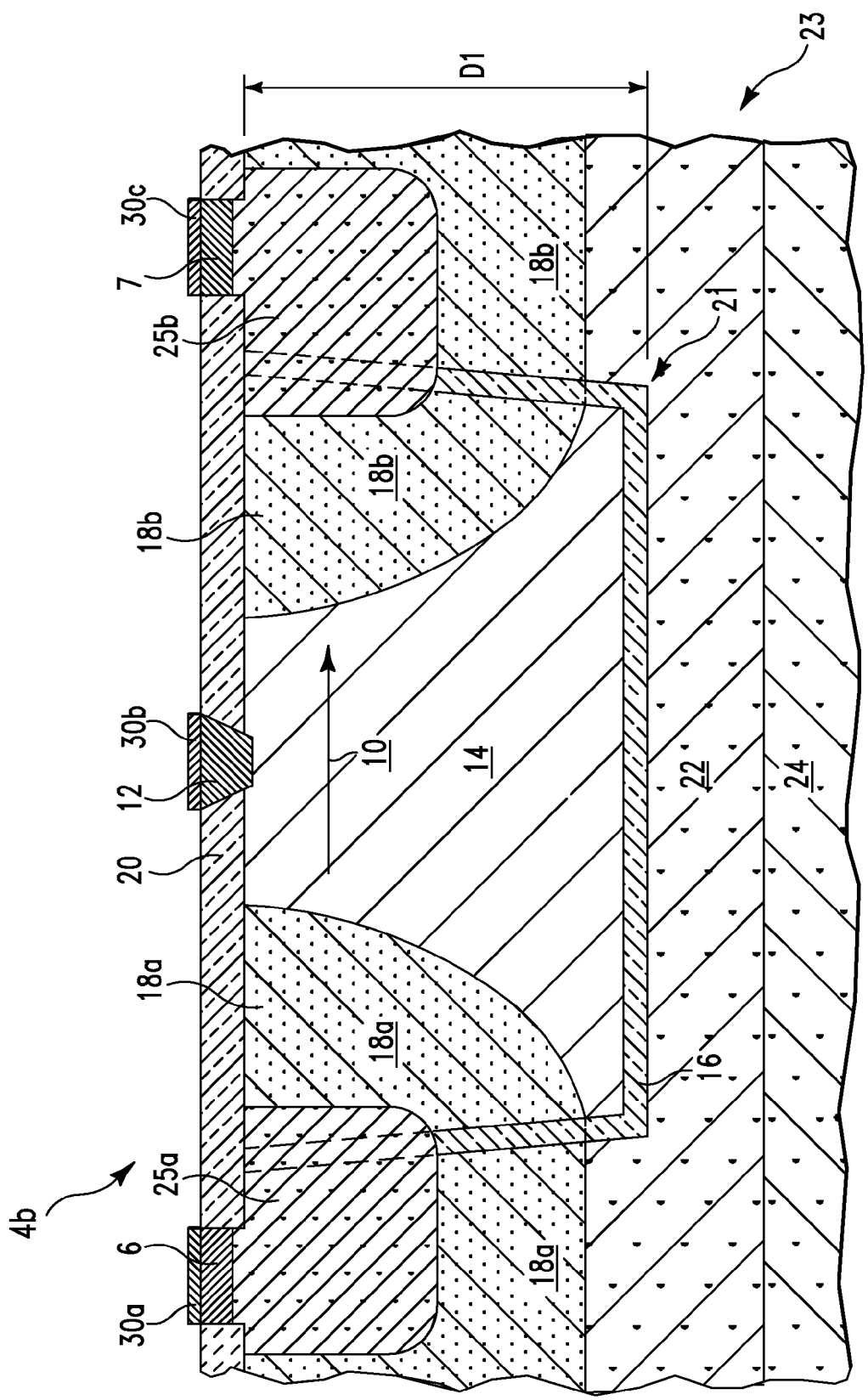
FIG. 2B illustrates a cross sectional view of the electrical structure of FIG. 2A, in accordance with embodiments of the present invention.

FIG. 2B illustrates a cross sectional view of electrical structure 4b of FIG. 2A, in accordance with embodiments of the present invention. The cross sectional view of FIG. 2B is taken along line 2B-2B of FIG. 2A.

Figure 3A:
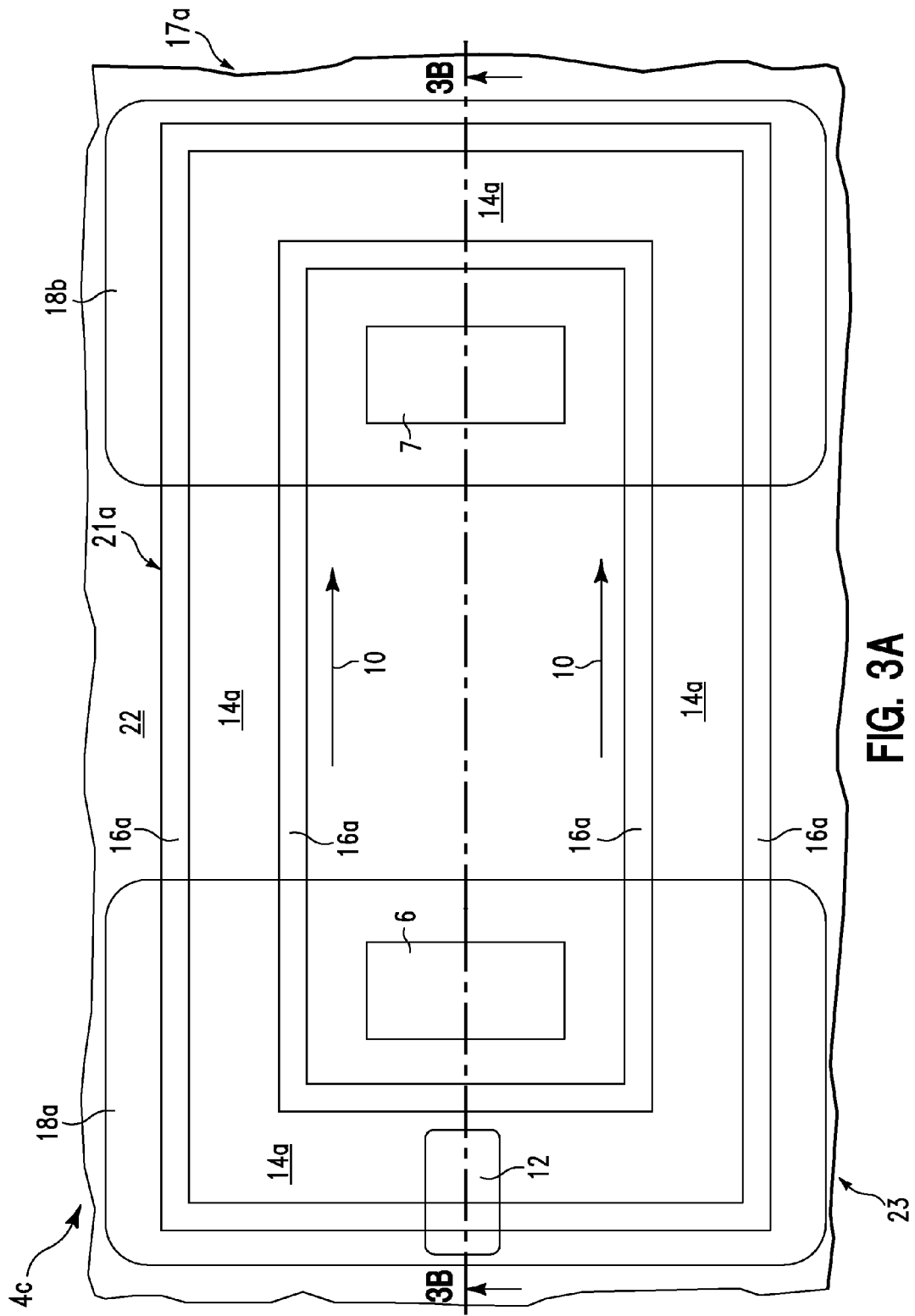
FIG. 3A depicts a second alternative to FIG. 1A, in accordance with embodiments of the present invention.

FIG. 3A depicts a second alternative to FIG. 1A illustrating a top view of an electrical structure 4c, in accordance with embodiments of the present invention. In contrast with electrical structure 4a FIG. 1A, electrical structure 4c of FIG. 3A comprises a deep trench 21a forming a perimeter surrounding FET 17a. A gate dielectric (e.g., oxide) liner 16a is formed within (i.e., lining) deep trench 21a and a gate structure 14a is formed over gate dielectric liner 16a and within trench 21a. Deep trench 21a, gate dielectric (e.g., oxide) liner 16a, and gate structure 14a in combination form a perimeter structure that surrounds FET 17a. The perimeter structure formed by deep trench 21a, gate dielectric (e.g., oxide) liner 16a, and gate structure 14a isolates (i.e., electrically and mechanically) FET 17a from additional components (e.g., FETS, resistors, capacitors, wires, etc) that are located on electrical structure 4c. Gate dielectric (e.g., oxide) liner 16a may comprise a thickness of about 3000 A.

Figure 3B:
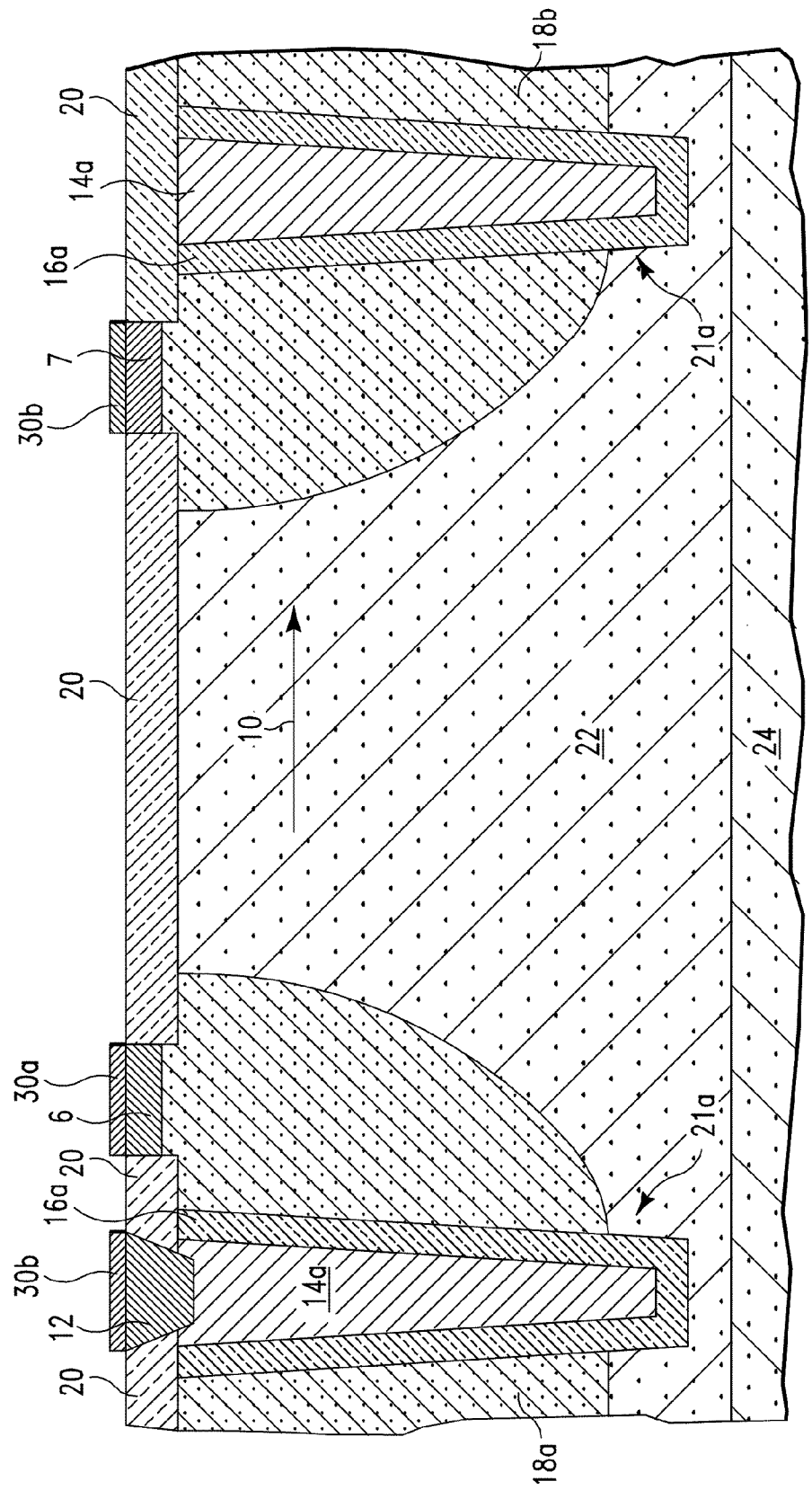
FIG. 3B illustrates a cross sectional view of the electrical structure of FIG. 3A, in accordance with embodiments of the present invention.

FIG. 3B illustrates a cross sectional view of electrical structure 4c of FIG. 3A, in accordance with embodiments of the present invention. The cross sectional view of FIG. 3B is taken along line 3B-3B of FIG. 3A.

Figure 4:
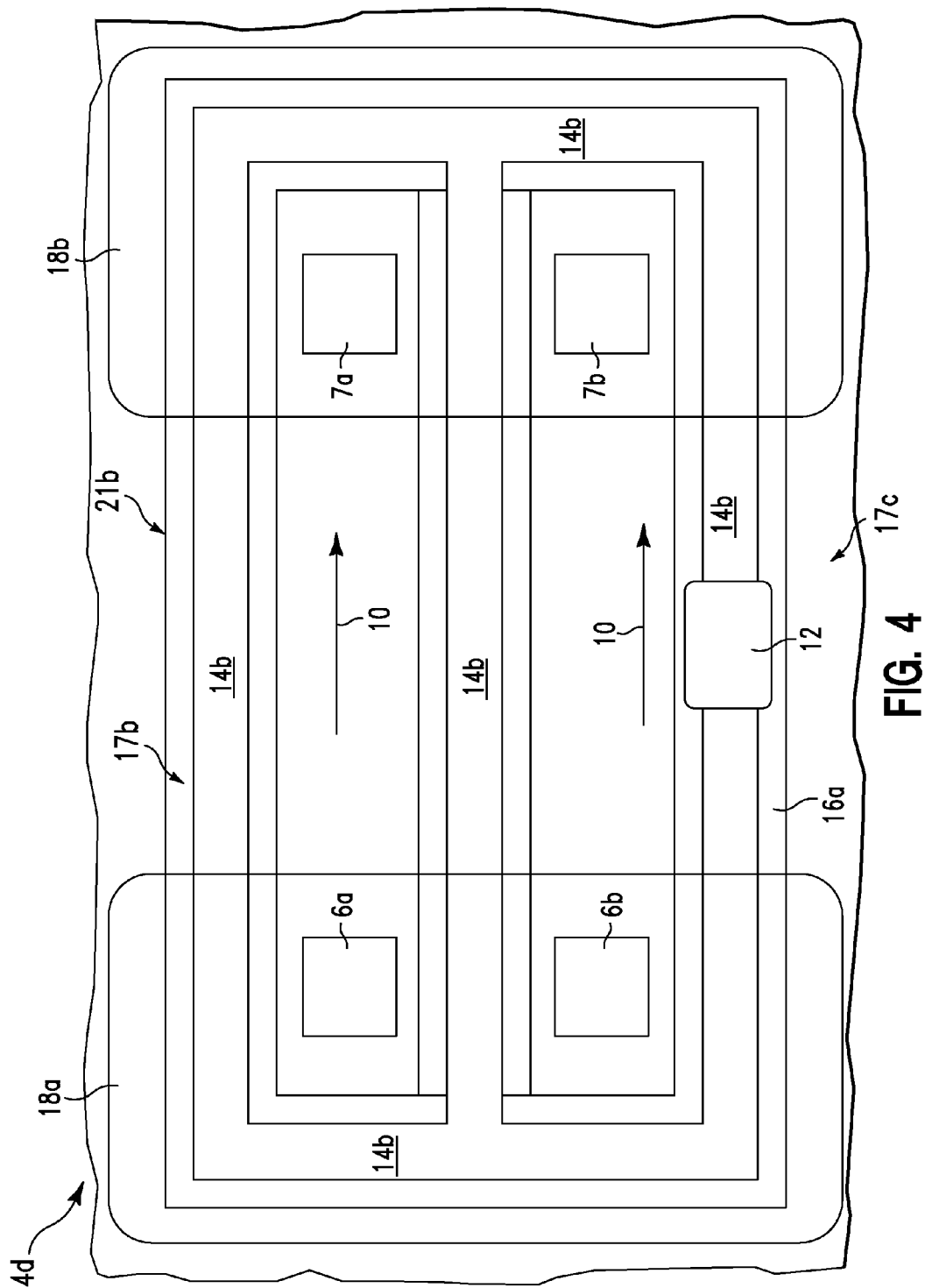
FIG. 4 depicts a first alternative to FIG. 3A, in accordance with embodiments of the present invention

FIG. 4 depicts a first alternative to FIG. 3A illustrating a top view of an electrical structure 4d, in accordance with embodiments of the present invention. In contrast with electrical structure 4c FIG. 3A, electrical structure 4d of FIG. 4 comprises a deep trench 21b forming a perimeter surrounding FET 17b and FET 17c. Additionally, deep trench 21b is formed between FET 17b and FET 17c. A gate dielectric (e.g., oxide) liner 16b is formed within (i.e., lining) deep trench 21b and a gate structure 14b is formed over gate dielectric liner 16b and within trench 21b. Deep trench 21b, gate dielectric (e.g., oxide) liner 16b, and gate structure 14b in combination form a perimeter structure that surrounds FET 17b and FET 17c. Additionally, deep trench 21b, gate dielectric (e.g., oxide) liner 16b, and gate structure 14b in combination form an isolation structure that separates FET 17b from FET 17c. The structure formed by deep trench 21b, gate dielectric (e.g., oxide) liner 16b, and gate structure 14b isolates (i.e., electrically and mechanically) FET 17b from FET 17c. Additionally, the structure formed by deep trench 21b, gate dielectric (e.g., oxide) liner 16b, and gate structure 14b isolates (i.e., electrically and mechanically) FET 17b and FET 17c from additional components (e.g., FETS, resistors, capacitors, wires, etc) that are located on electrical structure 4d. Gate dielectric (e.g., oxide) liner 16b may comprise a thickness of about 3000 A.

Figure 5:
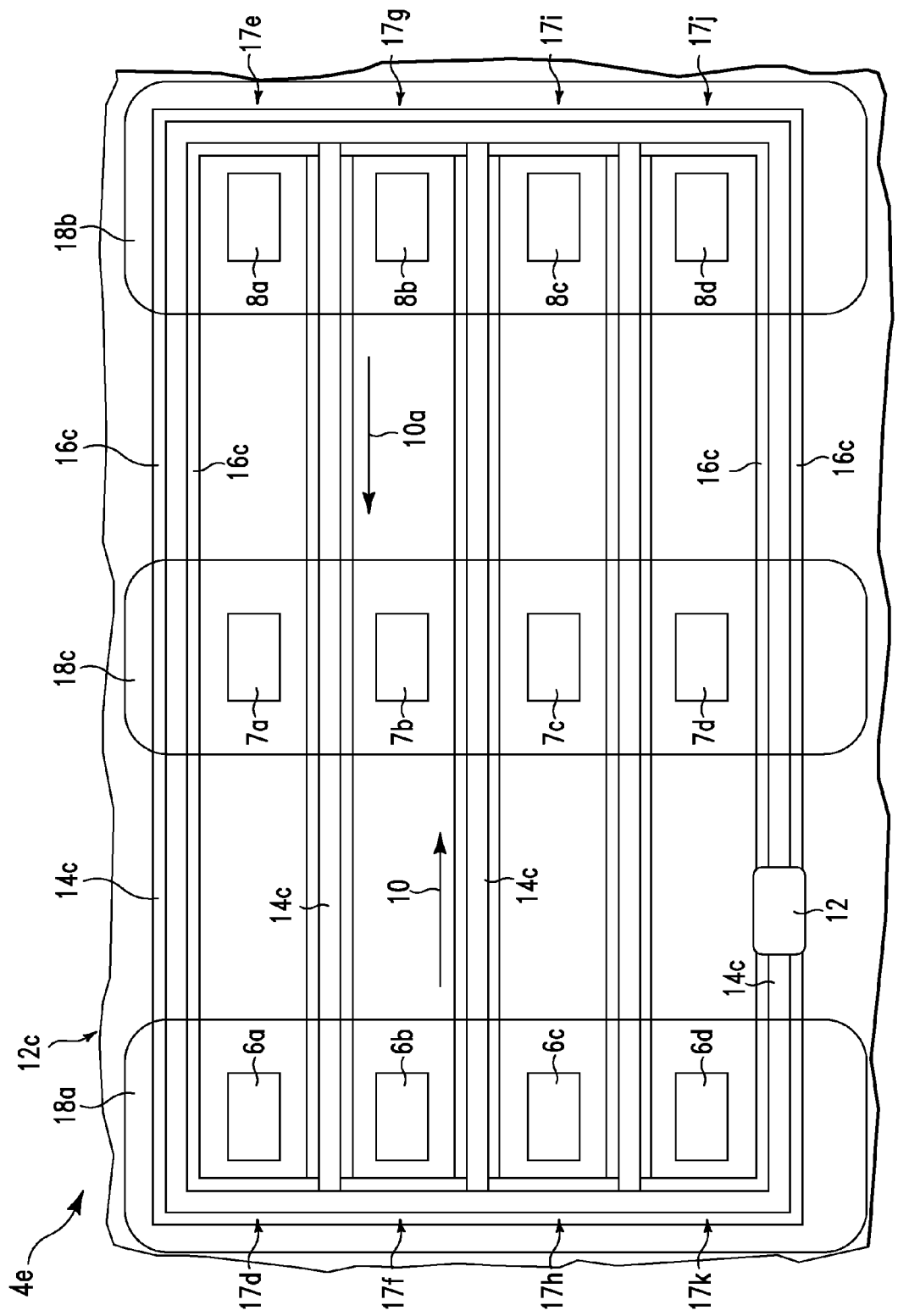
FIG. 5 depicts a first alternative to FIG. 4, in accordance with embodiments of the present invention

FIG. 5 depicts a first alternative to FIG. 4 illustrating a top view of an electrical structure 4e, in accordance with embodiments of the present invention. In contrast with electrical structure 4d FIG. 4, electrical structure 4e of FIG. 5 comprises a plurality of FETs 17d . . . 17k. FET 17d comprises a source 6a, a drain 7a, and a gate structure 16c. FET 17e comprises a source structure 8a, drain structure 7a (i.e., a shared drain structure), and gate structure 16c. FET 17f comprises a source structure 6b, a drain structure 7b, and gate structure 16c. FET 17g comprises a source structure 8b, drain structure 7b (i.e., a shared drain structure), and gate structure 16c. FET 17h comprises a source structure 6c, a drain structure 7c, and gate structure 16c. FET 17i comprises a source structure 8c, drain structure 7c (i.e., a shared drain structure), and gate structure 16c. FET 17k comprises a source structure 6d, a drain structure 7d, and gate structure 16c. FET 17j comprises a source structure 8d, drain structure 7d (i.e., a shared drain structure), and gate structure 16c. Electrical structure 4e comprises a deep trench 21c forming a perimeter surrounding FETs 17d . . . 17k. Additionally, deep trench 21c comprises portions formed between:

1. FETS 17d and 17e and FETS 17f and 17g.
2. FETS 17f and 17g and FETS 17h and 17i.
3. FETS 17h and 17i and FETS 17k and 17j.

A gate dielectric (e.g., oxide) liner 16c is formed within (i.e., lining) deep trench 21c and a gate structure 14c is formed over gate dielectric liner 16c and within trench 21c. Deep trench 21c, gate dielectric (e.g., oxide) liner 16c, and gate structure 14c in combination form a perimeter structure that surrounds FETs 17d . . . 17k. Additionally, deep trench 21c, gate dielectric (e.g., oxide) liner 16c, and gate structure 14c in combination form an isolation structure that separates:

1. FETS 17d and 17e from FETS 17f and 17g.
2. FETS 17f and 17g from FETS 17h and 17i.
3. FETS 17h and 17i from FETS 17k and 17j.

The structure formed by deep trench 21c, gate dielectric (e.g., oxide) liner 16c, and gate structure 14c isolates (i.e., electrically and mechanically):

1. FETS 17d and 17e from FETS 17f and 17g.
2. FETS 17f and 17g from FETS 17h and 17i.
3. FETS 17h and 17i from FETS 17k and 17j.

Additionally, the structure formed by deep trench 21c, gate dielectric (e.g., oxide) liner 16c, and gate structure 14c isolates (i.e., electrically and mechanically) FETS 17d . . . 17k a from additional components (e.g., FETS, resistors, capacitors, wires, etc) that are located on electrical structure 4e. Gate dielectric (e.g., oxide) liner 16c may comprise a thickness of about 3000 A.

Figure 6A:
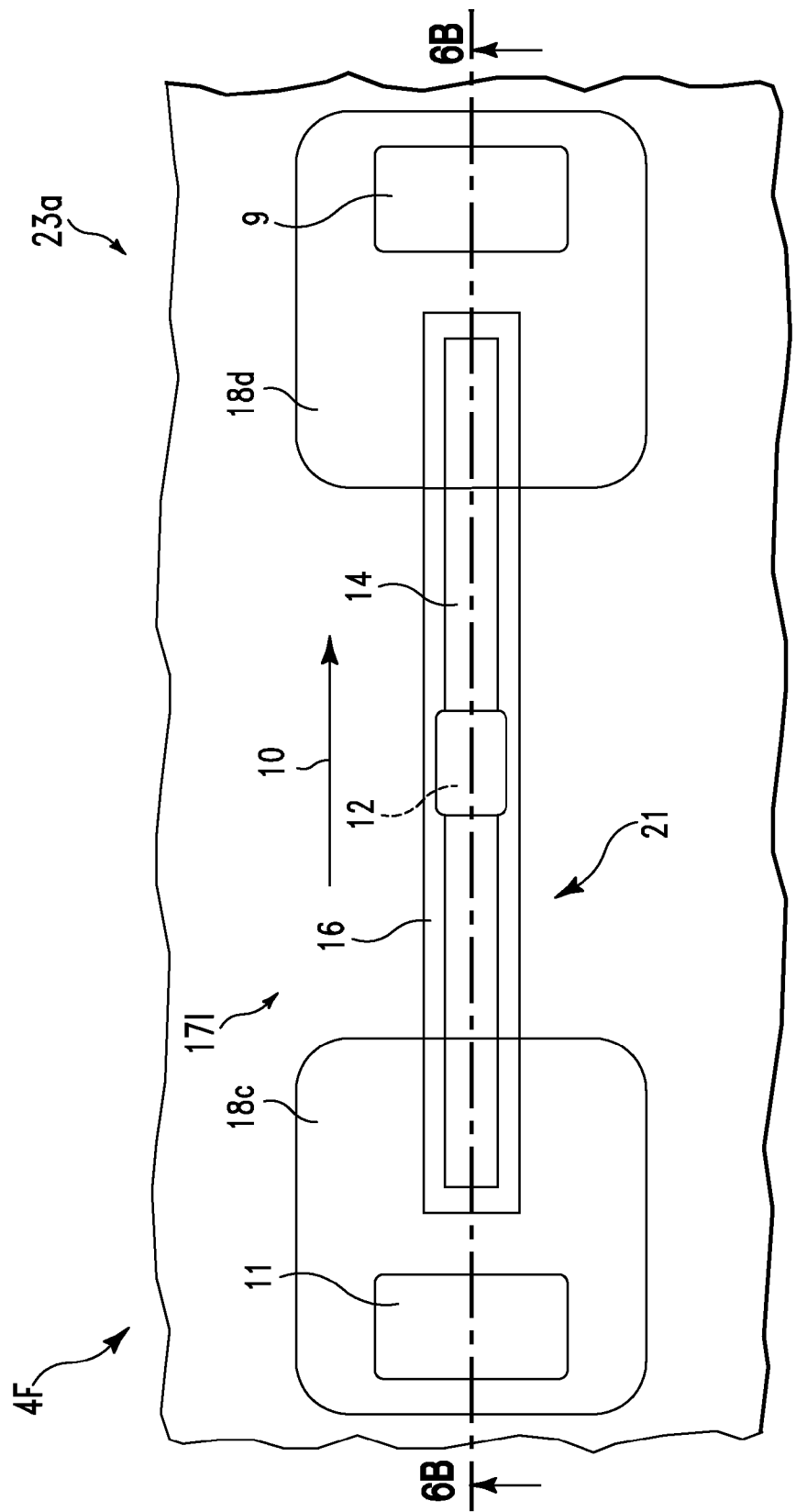
FIG. 6A depicts a third alternative to FIG. 1A, in accordance with embodiments of the present invention.

FIG. 6A depicts a third alternative to FIG. 1A illustrating a top view of an electrical structure 4f, in accordance with embodiments of the present invention. In contrast with electrical structure 4a FIG. 1A, electrical structure 4f of FIG. 6A comprises a field effect transistor (FET) 17l formed on a P substrate 24. FET 17l comprises an N+ source structure 11 formed over an N-tub 18c and an N+ drain structure 9 formed over a N-tub 18d.

Figure 6B:
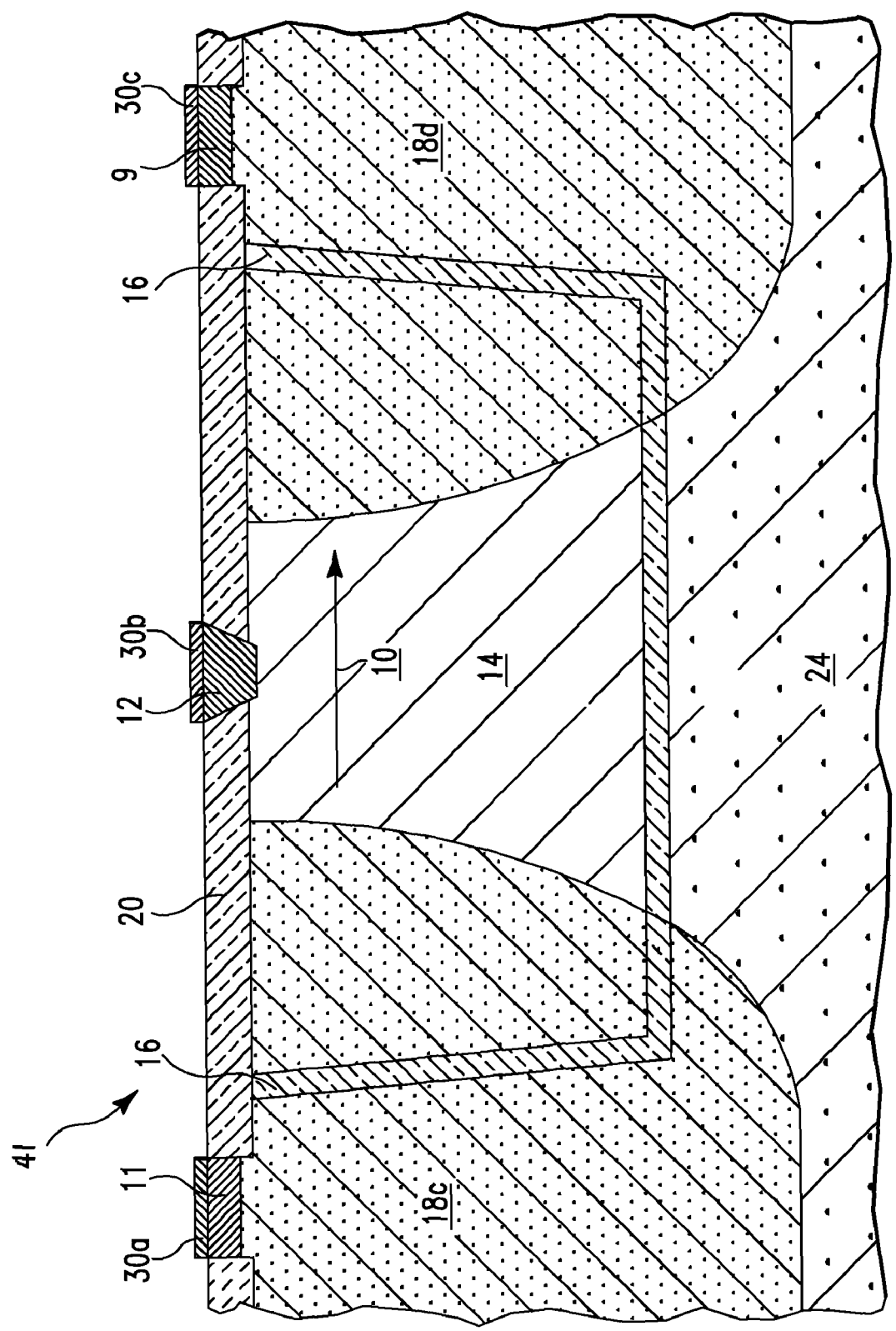
FIG. 6B illustrates a cross sectional view of the electrical structure of FIG. 6A, in accordance with embodiments of the present invention.

FIG. 6B illustrates a cross sectional view of electrical structure 4a of FIG. 6A, in accordance with embodiments of the present invention. The cross sectional view of FIG. 6B is taken along line 6B-6B of FIG. 6A.

Figure 7A:
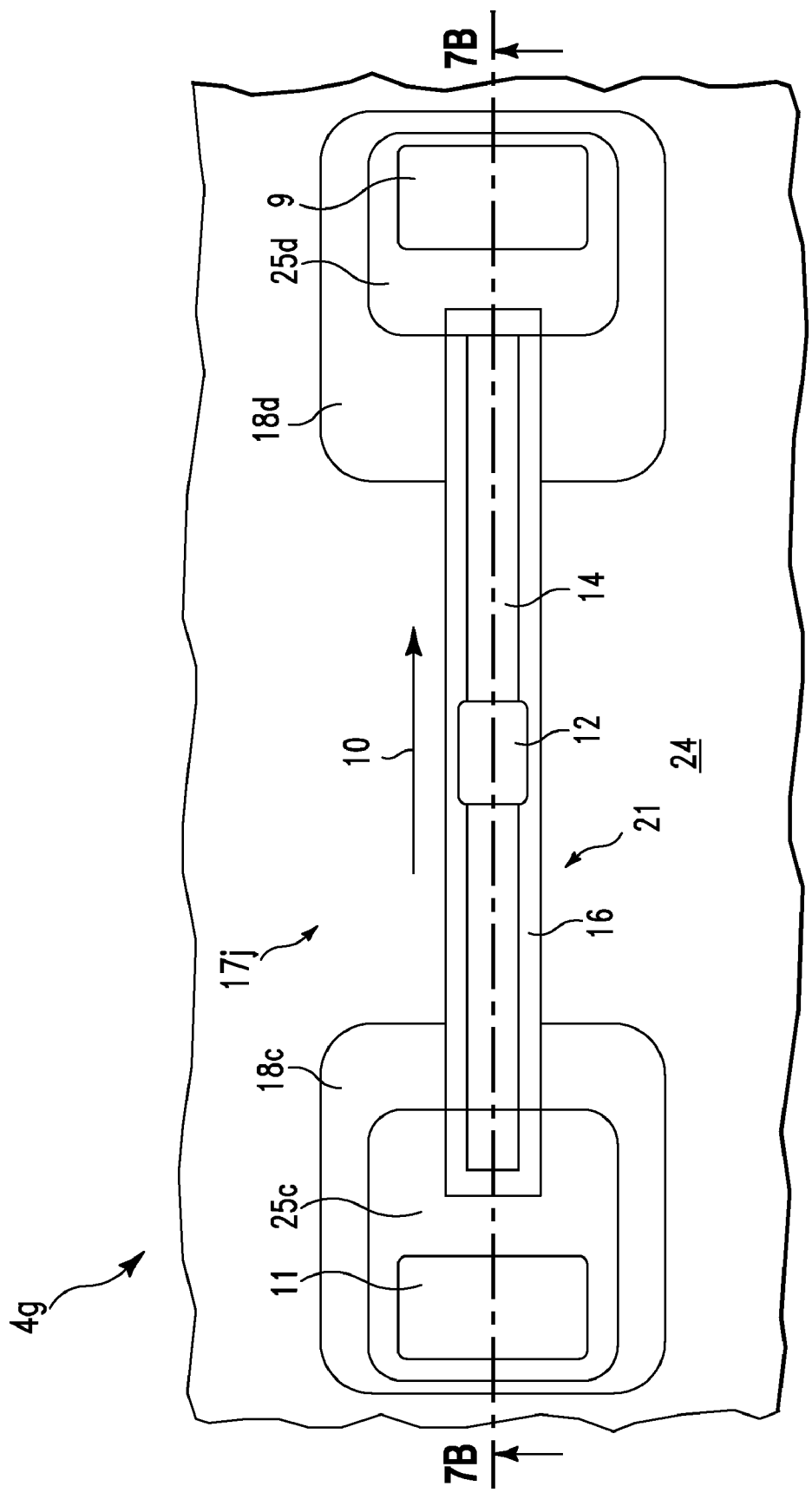
FIG. 7A depicts a first alternative to FIG. 6A, in accordance with embodiments of the present invention.

FIG. 7A depicts a first alternative to FIG. 6A illustrating a top view of an electrical structure 4g, in accordance with embodiments of the present invention. In contrast with electrical structure 4f FIG. 6A, electrical structure 4g of FIG. 7A comprises an FET 17j that comprises an N-well 25c formed between N-tub 18c and source structure 11 and an N-well 25d formed between N-tub 18d and drain structure 7. An N-well is defined herein as a moderately N doped CMOS device.

Figure 7B:
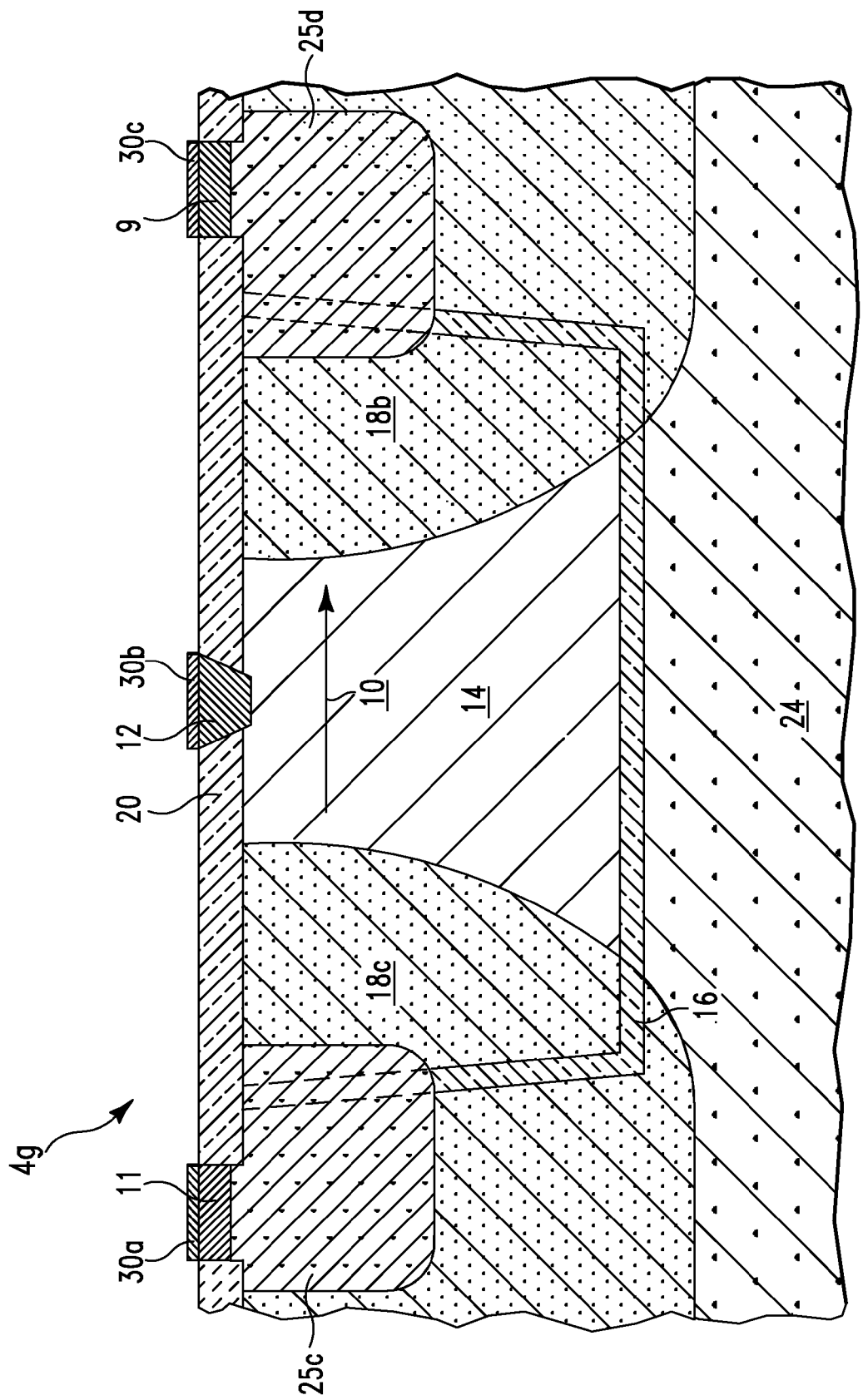
FIG. 7B illustrates a cross sectional view of the electrical structure of FIG. 7A, in accordance with embodiments of the present invention.

FIG. 7B illustrates a cross sectional view of electrical structure 4g of FIG. 7A, in accordance with embodiments of the present invention. The cross sectional view of FIG. 7B is taken along line 7B-7B of FIG. 7A.

FIG. 8A depicts a combination FIGS. 2A and 3A illustrating a top view of an electrical structure 4h, in accordance with embodiments of the present invention. FIG. 8A comprises the P-wells 25a and 25b of FIG. 2A added to FET 17a of FIG. 3A. In contrast with electrical structure FIGS. 2A and 3A, electrical structure 4h of FIG. 8A comprises a gate contact 12a in an alternative location.

Figure 8B:
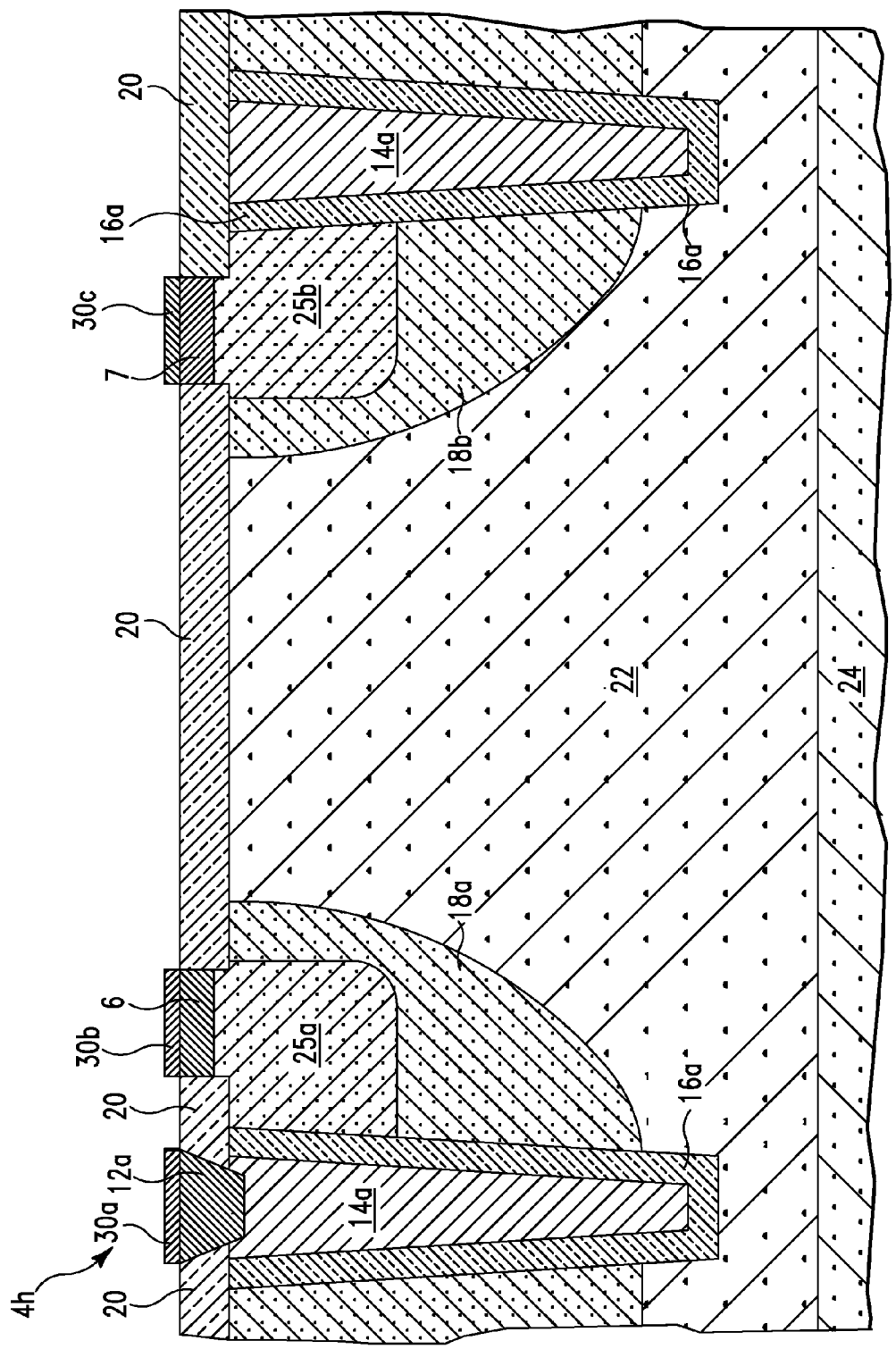
FIG. 8B illustrates a cross sectional view of the electrical structure of FIG. 8A, in accordance with embodiments of the present invention.

FIG. 8B illustrates a cross sectional view of electrical structure 4h of FIG. 8A, in accordance with embodiments of the present invention. The cross sectional view of FIG. 8B is taken along line 8B-8B of FIG. 8A.

Figure 9A:
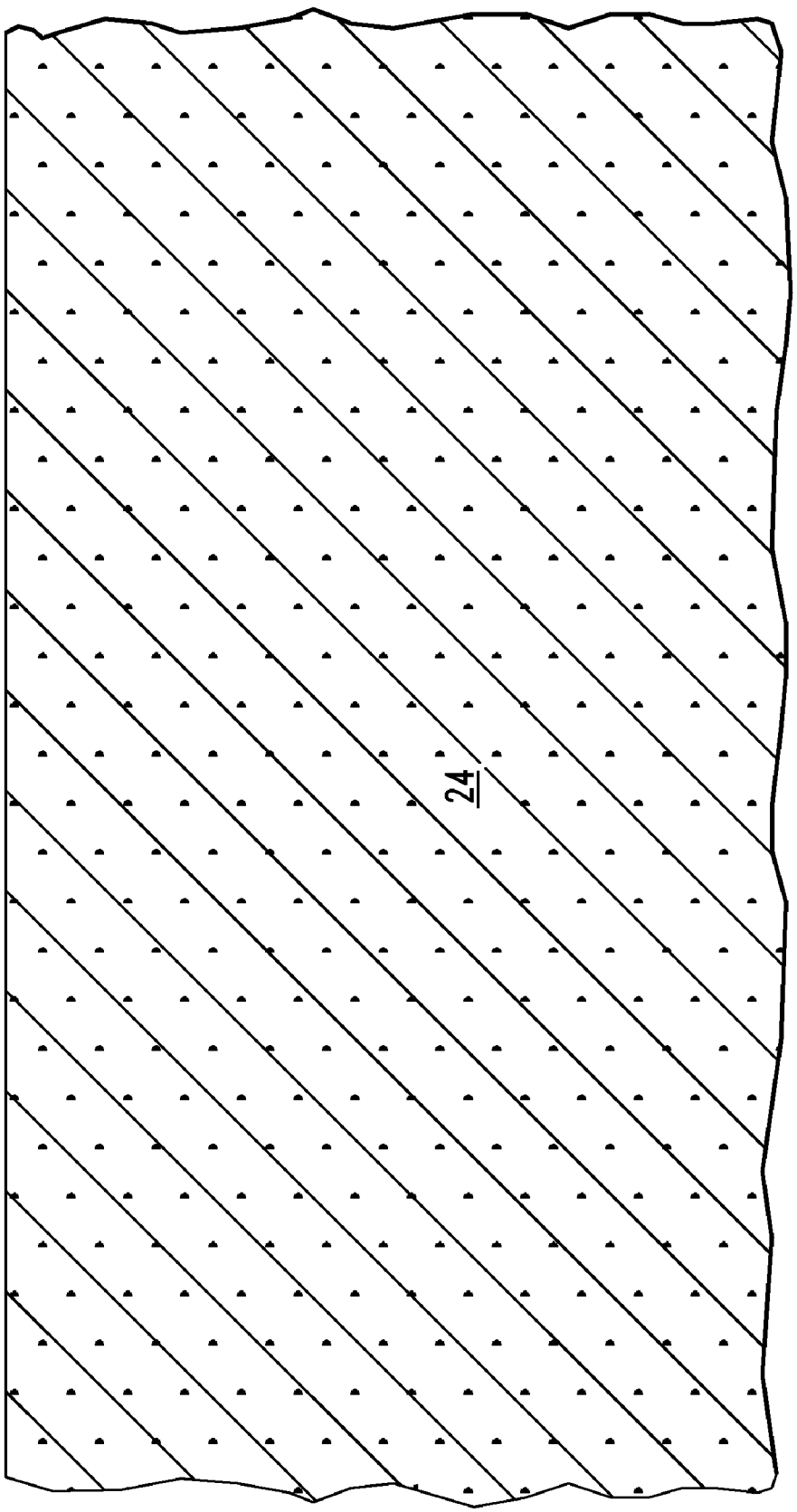

FIGS. 9A-4H illustrate a process for generating electrical structure 4h of FIGS. 8A and 8B, in accordance with embodiments of the present invention.

FIG. 9A illustrates a cross sectional view of a P type substrate 24, in accordance with embodiments of the present invention.

FIG. 9B illustrates a cross sectional view of an N-tub layer 22 formed from P type substrate 24, in accordance with embodiments of the present invention. N-tub layer 22 may be implanted and annealed to diffuse.

Figure 9C:
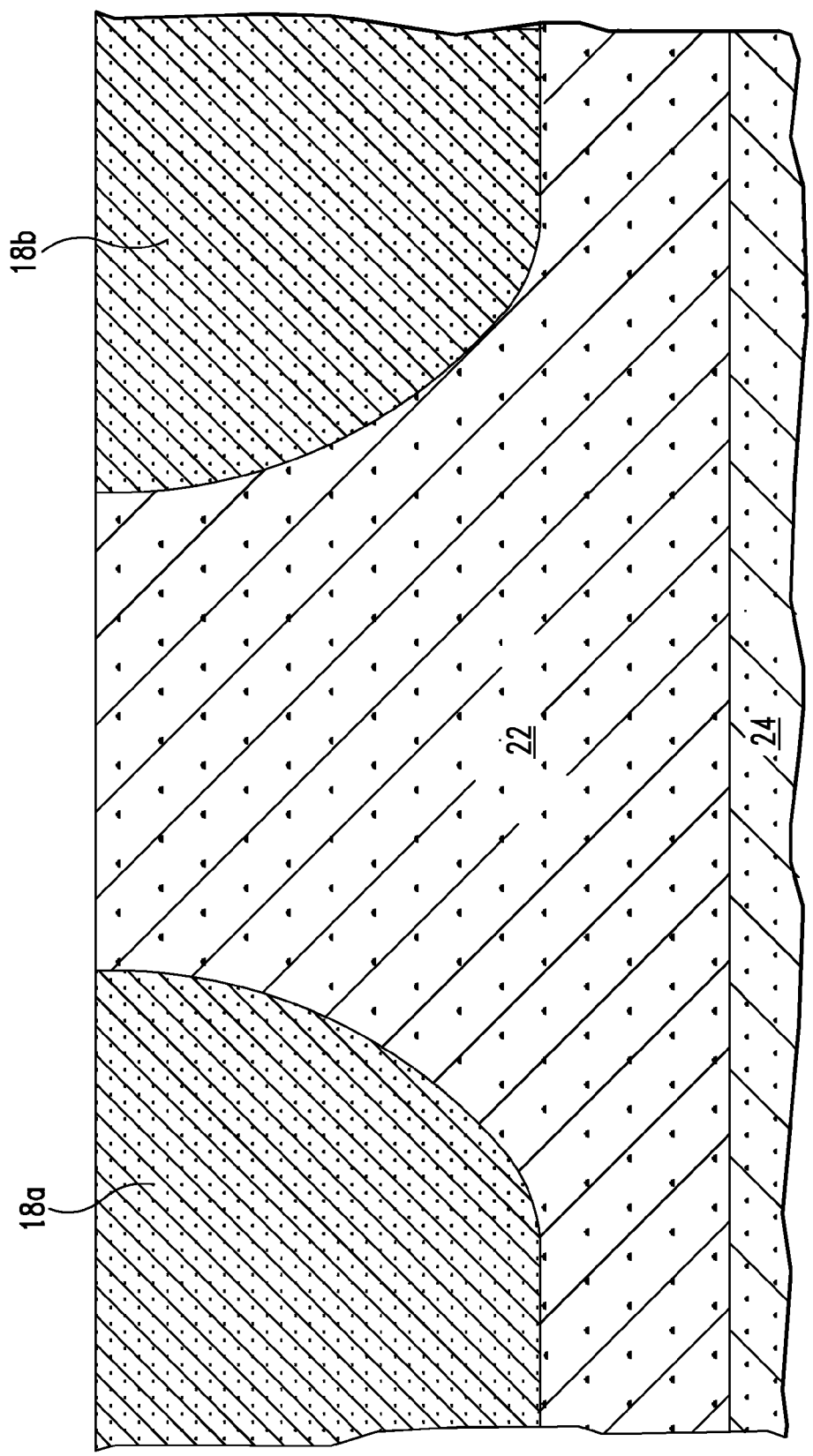

FIG. 9C illustrates a cross sectional view of P tub implants 18a and 18b formed from N-tub layer 22, in accordance with embodiments of the present invention. P tub implants 18a and 18b may be implanted and annealed to diffuse.

Figure 9D:
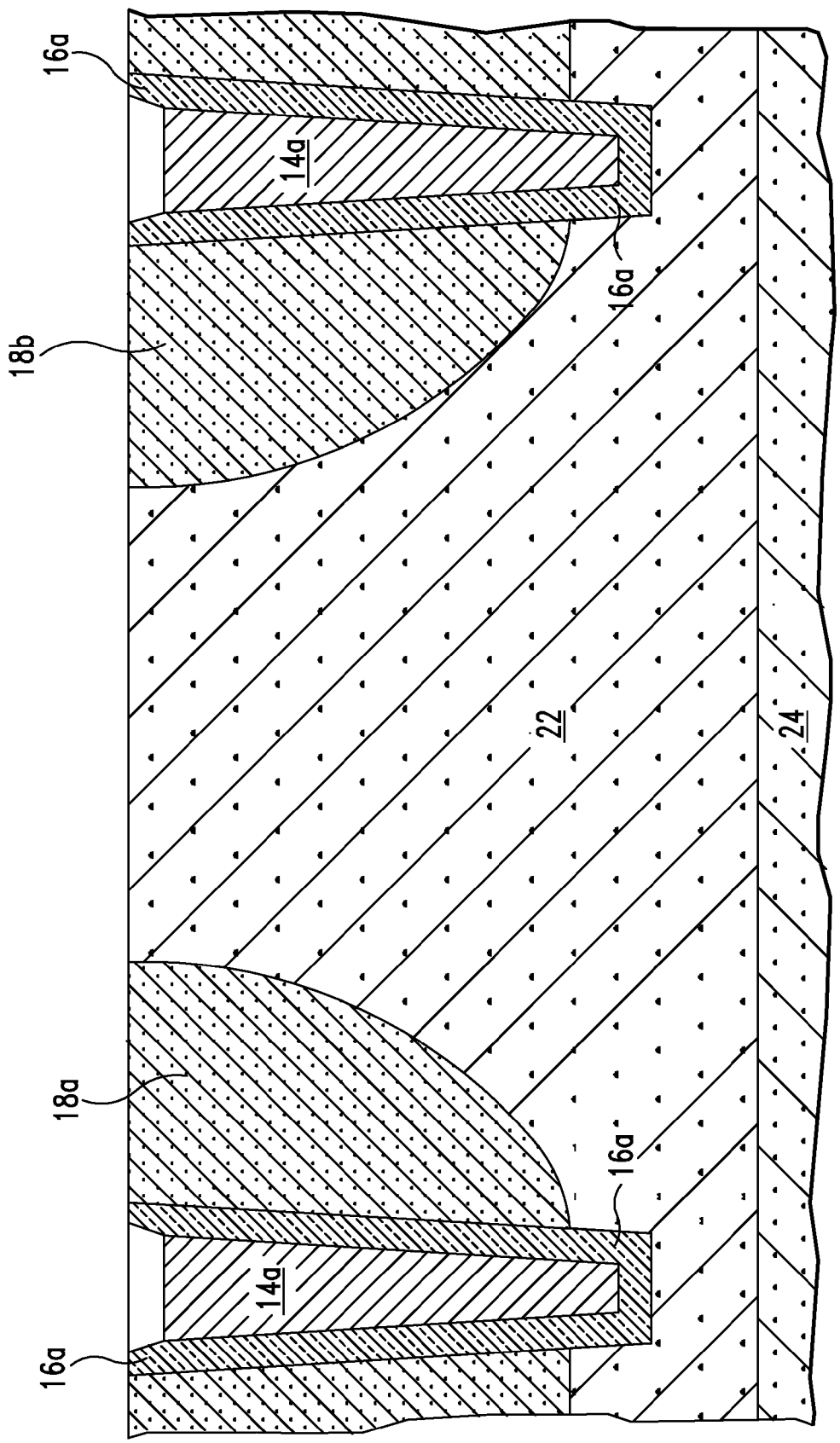

FIG. 9D illustrates a cross sectional view of gate structure 12a formed in deep trench 21a, in accordance with embodiments of the present invention. Deep trench 21a is etched to comprise a width of about 1 um and a depth of about 6 um. Gate dielectric (e.g., oxide) liner 16a is formed in deep trench 21a and gate structure 14a is formed over gate dielectric liner 16a.

Figure 9E:
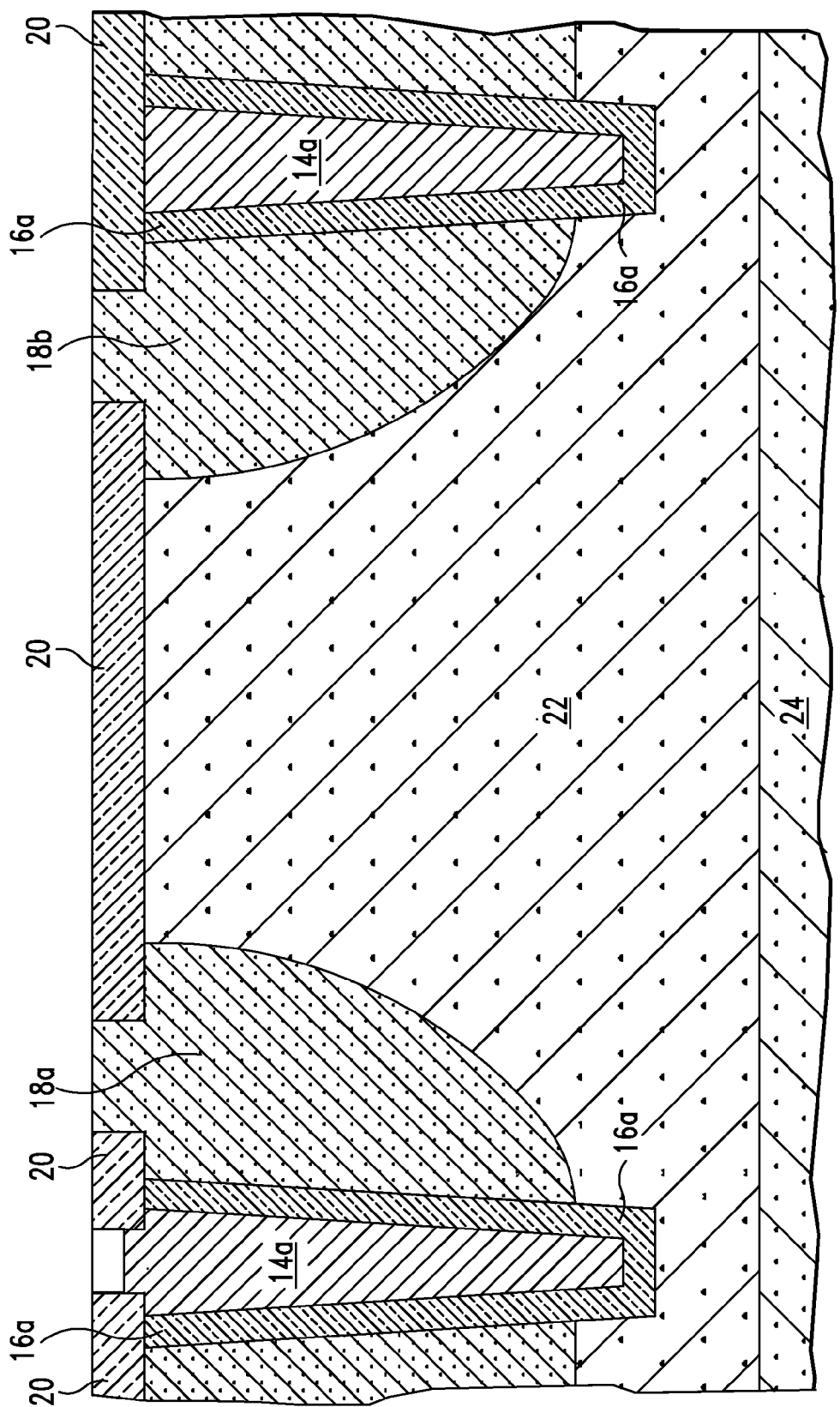

FIG. 9E illustrates a cross sectional view of shallow trench isolation structure 20 formed over N-tub layer 22, in accordance with embodiments of the present invention.

Figure 9F:
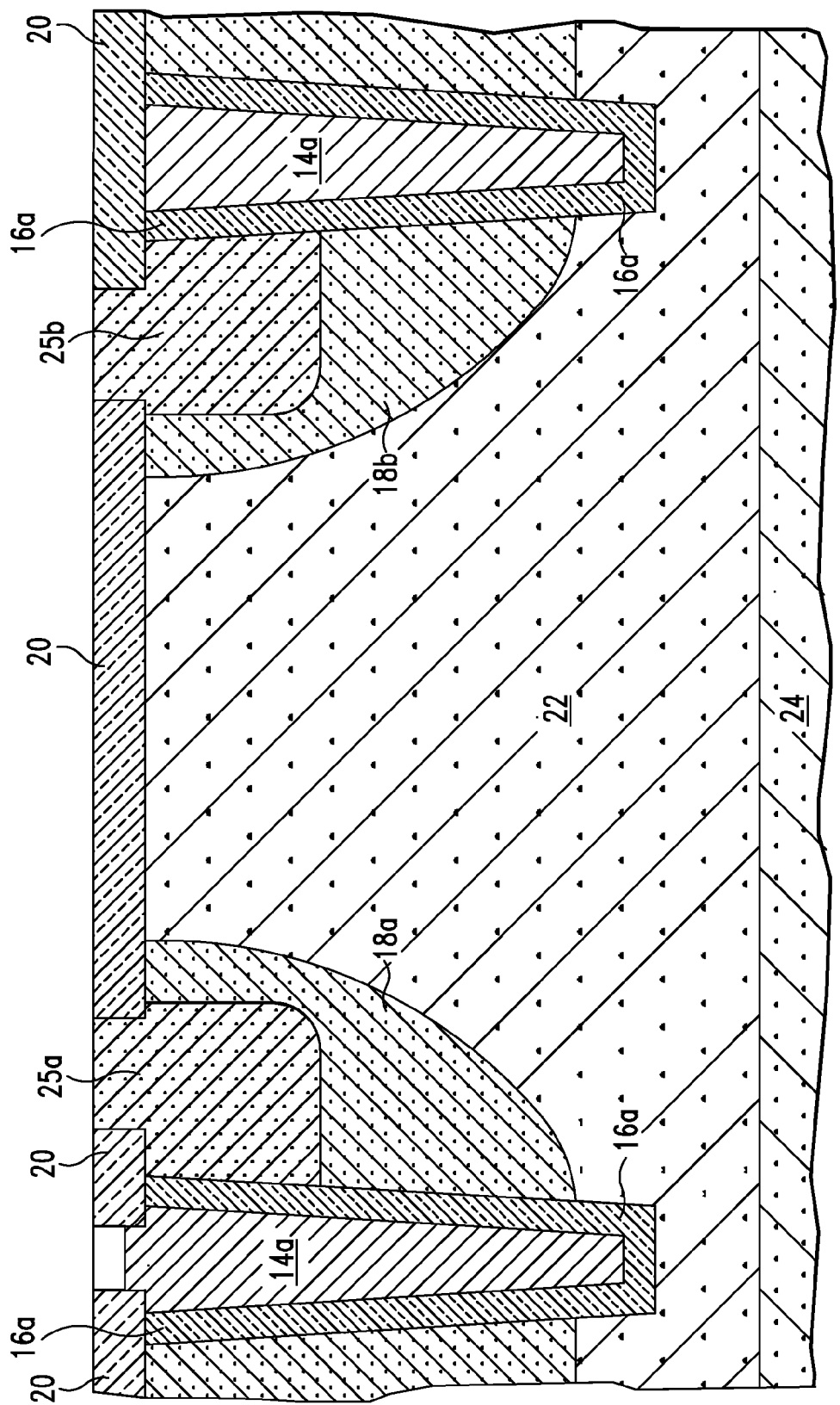

FIG. 9F illustrates a cross sectional view of P wells 25a and 25b formed in P tubs 18a and 18b, in accordance with embodiments of the present invention.

Figure 9G:
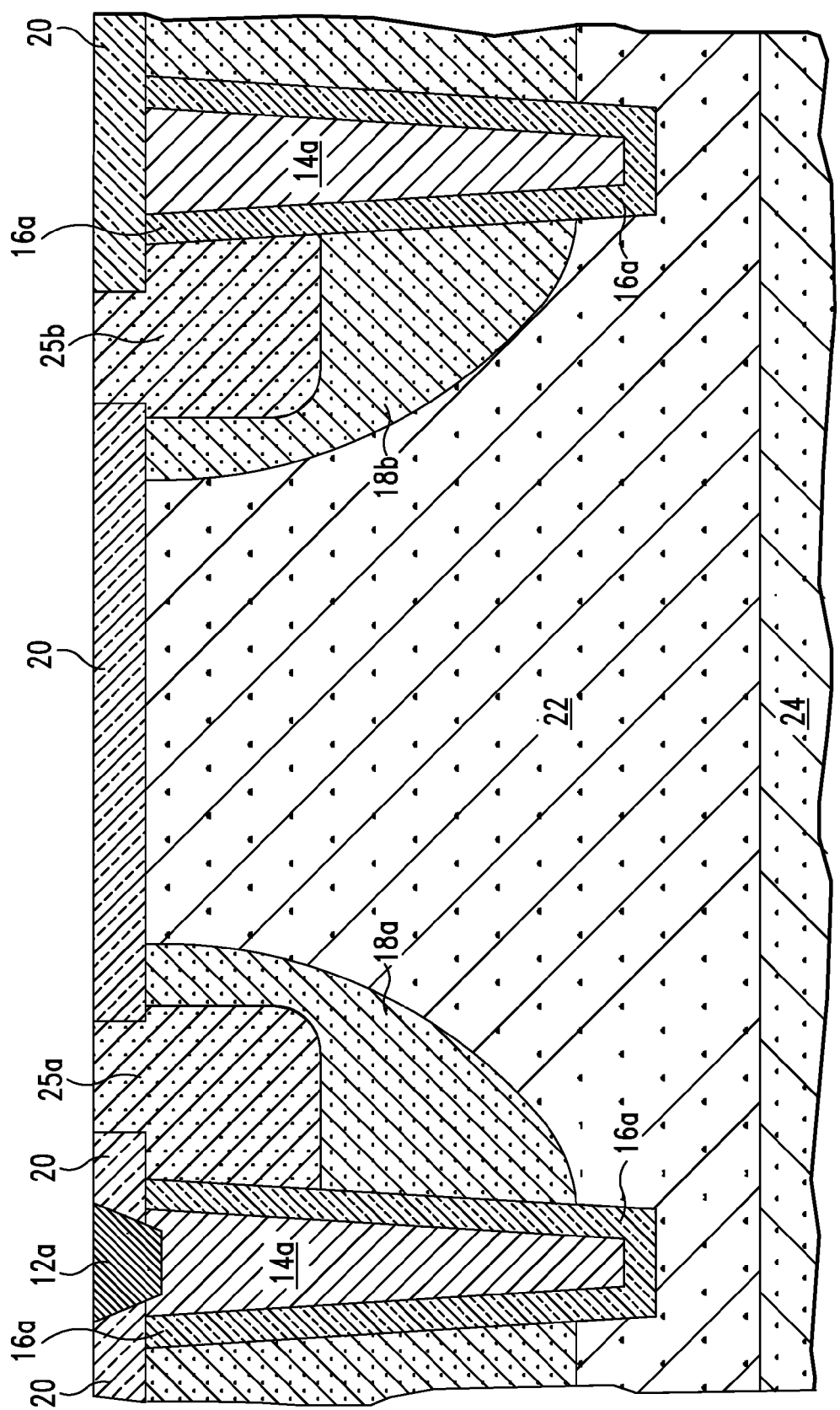

FIG. 9G illustrates a cross sectional view of FIG. 9F after gate contact 12a has been formed, in accordance with embodiments of the present invention.

Figure 9H:
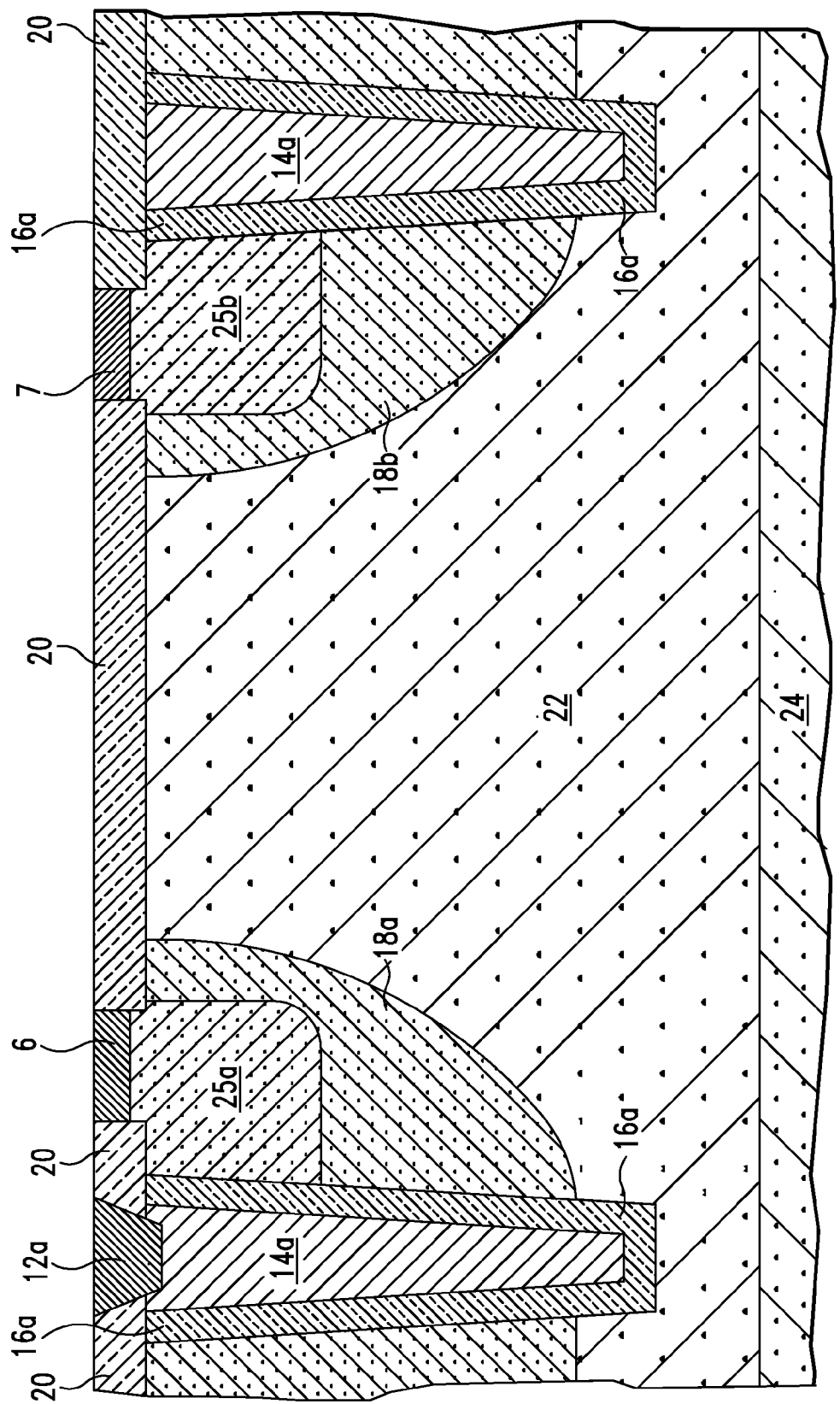

FIG. 9H illustrates a cross sectional view of FIG. 9G after source structure 6 and drain structure 7 have been formed, in accordance with embodiments of the present invention.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:
1. An electrical structure comprising:
a semiconductor substrate comprising a deep trench;
a shallow trench isolation layer formed over said semiconductor substrate;
an oxide liner layer formed over an exterior surface of said deep trench;
a first field effect transistor (FET) formed within said semiconductor substrate, wherein said first FET comprises a first source structure, a first drain structure, and a first gate structure, wherein said first gate structure comprises a first gate contact connected to a first polysilicon fill structure, wherein said first gate contact extends through said shallow trench isolation layer and through a top surface of said first polysilicon fill structure, wherein said first polysilicon fill structure is formed over said oxide liner layer and within said deep trench, wherein said first polysilicon fill structure is configured to flow current laterally across said first polysilicon fill structure such that said current will flow parallel to a top surface of said semiconductor substrate;
a first P tub formed within said semiconductor substrate and below said shallow trench isolation layer, wherein said shallow trench isolation layer comprises a first opening, wherein said first source structure extends from a top surface of said shallow trench isolation layer into a first portion of said first opening, wherein a first portion of said first P tub extends from a bottom surface of said shallow trench isolation layer and into a second portion of said first opening such that said first portion of said first P tub is in direct mechanical contact with said first source structure within said first opening; and
a second P tub formed within said semiconductor substrate and below said shallow trench isolation layer, wherein said shallow trench isolation layer comprises a second opening, wherein said first drain structure extends from said top surface of said shallow trench isolation layer into a first portion of said second opening, wherein a first portion of said second P tub extends from said bottom surface of said shallow trench isolation layer and into a second portion of said second opening such that said first portion of said second P tub is in direct mechanical contact with said first drain structure within said second opening.

2. The electrical structure of claim 1, wherein said deep trench, said oxide liner layer, and said first polysilicon fill structure in combination form a first perimeter that circumscribes said first source structure and said first drain structure.

3. The electrical structure of claim 1, wherein said first gate structure comprises a plurality of gate contacts connected to said first polysilicon fill structure.

4. The electrical structure of claim 1, wherein said first FET comprises a high voltage FET configured to operate at voltages selected from a range of about 10 volts to about 200 volts.

5. The electrical structure of claim 1, wherein said first polysilicon fill structure and said oxide liner layer extend through said shallow trench isolation layer and said first P tub into said semiconductor substrate, and wherein said first polysilicon fill structure and said oxide liner layer extend through said shallow trench isolation layer and said second P tub into said semiconductor substrate.

6. The electrical structure of claim 1, wherein said first gate contact comprises a first silicide contact layer formed over a top surface of said first gate contact.

7. The electrical structure of claim 6, wherein said first source structure comprises a second silicide contact layer formed over a top surface of said first source structure.

8. The electrical structure of claim 6, wherein said first drain structure comprises a second silicide contact layer formed over a top surface of said first drain structure.

9. The electrical structure of claim 1, wherein semiconductor substrate comprises a silicon layer formed over a P substrate.

10. The electrical structure of claim 1, wherein said first source structure is formed over and not within said semiconductor substrate.

11. The electrical structure of claim 1, wherein said first drain structure is formed over and not within said semiconductor substrate.

12. The electrical structure of claim 1, wherein said gate contact is formed over and not within said semiconductor substrate.

13. The electrical structure of claim 1, wherein said first P tub is in contact with said bottom surface of said shallow trench isolation layer and a first set of vertical surfaces of said shallow trench isolation layer, wherein said bottom surface of said shallow trench isolation layer comprises a horizontal surface, wherein said second P tub is in contact with said bottom surface of said shallow trench isolation layer and a second set of vertical surfaces of said shallow trench isolation layer, and wherein said first set differs from said second set.

14. The electrical structure of claim 1, wherein said first polysilicon fill structure and said oxide liner layer are formed below and in contact with said bottom surface of said shallow trench isolation layer.

\* \* \* \* \*